US007274147B2

(12) United States Patent
Shim et al.

(10) Patent No.: US 7,274,147 B2
(45) Date of Patent: Sep. 25, 2007

(54) MAGNETRON

(75) Inventors: Dong-ha Shim, Seoul (KR); Kuang-woo Nam, Yongin-si (KR); Yun-kwon Park, Dongducheon-si (KR); In-sang Song, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/303,986

(22) Filed: Dec. 19, 2005

(65) Prior Publication Data

US 2006/0138965 A1 Jun. 29, 2006

(30) Foreign Application Priority Data

Dec. 27, 2004 (KR) ...................... 10-2004-0113121

(51) Int. Cl.
*H03B 9/10* (2006.01)

(52) U.S. Cl. ................................ 315/39.75; 315/39.77

(58) Field of Classification Search ............. 315/39.51, 315/39.53, 39.55, 39.57, 39.75, 39.77; 219/761
See application file for complete search history.

(56) References Cited

U.S. PATENT DOCUMENTS

| | | | | |
|---|---|---|---|---|
| 4,588,965 | A * | 5/1986 | Cook | 331/91 |
| 2006/0118554 | A1* | 6/2006 | Aisenbrey | 219/761 |

* cited by examiner

*Primary Examiner*—David H. Vu
(74) *Attorney, Agent, or Firm*—Sughrue Mion pllc.

(57) ABSTRACT

A magnetron which generates a high-frequency energy in the Terahertz band is provided. The magnetron includes a cathode unit, which is connected to a terminal of a power source, and which selectively emits an electron according to when power is supplied; an anode block, which is connected to another terminal of the power source, and which has an operation chamber in which the emitted electron moves; and one or more resonance cavities which generate a high-frequency energy by a movement of the emitted electron; and a pair of magnet units forming a magnetic field in the operation chamber.

23 Claims, 5 Drawing Sheets

MAGNETRON

CROSS-REFERENCE TO RELATED APPLICATIONS

This application claims the benefit of Korean Patent Application No. 10-2004-0113121 filed on Dec. 27, 2004, in the Korean Intellectual Property Office, the disclosure of which is incorporated herein by reference in its entirety.

BACKGROUND OF THE INVENTION

1. Field of the Invention

The present invention relates to a magnetron. More particularly, the present invention relates to a magnetron that can generate a high frequency energy of the Tera Hertz (THz) band.

2. Description of the Related Art

The magnetron generates a high-frequency energy and is widely used in home appliances such as a microwave oven, as well as in industrial applications, such as the areas of data signal transmitting, medicine, and biotechnology.

Briefly looking into the structure and principle of magnetrons, a magnetron generally comprises a cylindrical positive pole, a negative pole on a central axis of the cylindrical positive pole, a magnet which forms a magnetic field in parallel with the axis direction of the negative pole, and a resonance cavity for generating a resonance of electric current. When a high voltage is supplied to the negative and positive poles of the magnetron with the above structure, electrons are emitted from the negative pole. The electrons collide with the resonance cavity, moving in a cycloid, due to interaction between an electric field and the magnetic field of the negative and positive pole, such that an electric current flows. Due to the continuous collision of electrons, the electric current is oscillated in the resonance cavity. The resonance cavity is electrically equivalent to a series circuit of an inductor and a capacitor, and if the frequency of the electric current is accorded with a resonance frequency of the series circuit, a high-frequency energy is generated that is an electromagnetic wave of the resonance frequency of high frequency. The high-frequency energy is picked up by a coupling iris and emitted by an antenna to a necessary place.

The energy produced in accordance with the above principles has a frequency of approximately 95 GHz and below. However, a study has recently increased the frequency of the energy generated from a magnetron to an energy band that is potentially in the Terahertz region (e.g., 300 G Hz~3 THz).

To increase the frequency of the energy, a large amount of electric current may flow to the negative pole. However, the negative pole may be easily deteriorated as the temperature thereof rises. Further, the negative pole may be damaged as emitted electrons return towards the negative pole and collide with the negative pole. Therefore, such conventional methods shorten the lifespan of the negative pole. Recently, a study has obtained a higher frequency by reducing the resonance cavity.

SUMMARY OF THE INVENTION

Exemplary embodiments of the present invention has been conceived to solve the above-mentioned problems occurring in the prior art, and disadvantages not described above. Also, the present invention is not required to overcome the disadvantages described above, and an exemplary embodiment of the present invention may not overcome any of the problems described above.

An aspect of the present invention is to provide a magnetron that can generate energy in the Terahertz (THz) band.

Another aspect of the present invention is to provide a magnetron that can be microminiaturized.

According to an exemplary embodiment of the present invention, there is provided a magnetron comprising: a cathode unit connected to a terminal of a power source and selectively emitting an electron according to whether a power is supplied, an anode block connected to the other terminal of the power source and having an operation chamber with the emitted electron moving therein and at least one resonance cavity generating a high frequency energy by a movement of the electron, and a pair of magnet units forming a magnetic field in the operation chamber.

The cathode unit comprises a cathode electrode, and a nano-tube formed on an outer circumference of the cathode electrode.

According to an exemplary embodiment of the present invention, the resonance cavity comprises a plurality of resonance cavities, which are radially arranged at regular intervals on the basis of the operation chamber. The operation chamber and the resonance cavity are cylindrical. The anode block has a plurality of connection slots fluidly communicating with the resonance cavity and the operation chamber, and an emission part picking up the high frequency energy and emitting the energy to a necessary place. The emission part comprises a coupling iris fluidly communicated with at least one of the resonance cavities, and a waveguide fluidly communicated with the coupling iris. A sealing member is attached to the anode block to airtightly seal the waveguide, and comprises an insulator. The anode block comprises a first and a second anode block with same configurations at facing surfaces. The first and the second anode blocks are made of a silicon substrate, and a conductive layer is deposited on surfaces that face each other. The conductive layer comprises aurum (Au). The plurality of magnet units comprise a first and a second magnets respectively attached to opposite surfaces of the facing surfaces of the first and the second anode blocks and having first and second magnet connection holes in each center; and a first and a second sleeves of which part is inserted into the first and the second magnet connection holes, and of which the remaining part is inserted into first and second connection holes formed on both sides of the operation chamber, and in which both sides of the cathode unit are inserted. The first and the second sleeves are nonconductors.

According to another exemplary embodiment of the present invention, the pair of magnet units comprises a first and a second magnets with different magnetic poles; and first and second plates having first and second receiving parts receiving the first and the second magnets, and attached to both sides of the anode block. The anode block is made of conductive material.

BRIEF DESCRIPTION OF THE DRAWINGS

The above and other aspects of the present invention will be more apparent from the following detailed description of exemplary embodiments thereof with reference to the accompanying drawings, in which.

DETAILED DESCRIPTION OF THE EXEMPLARY EMBODIMENTS

Figure 1:
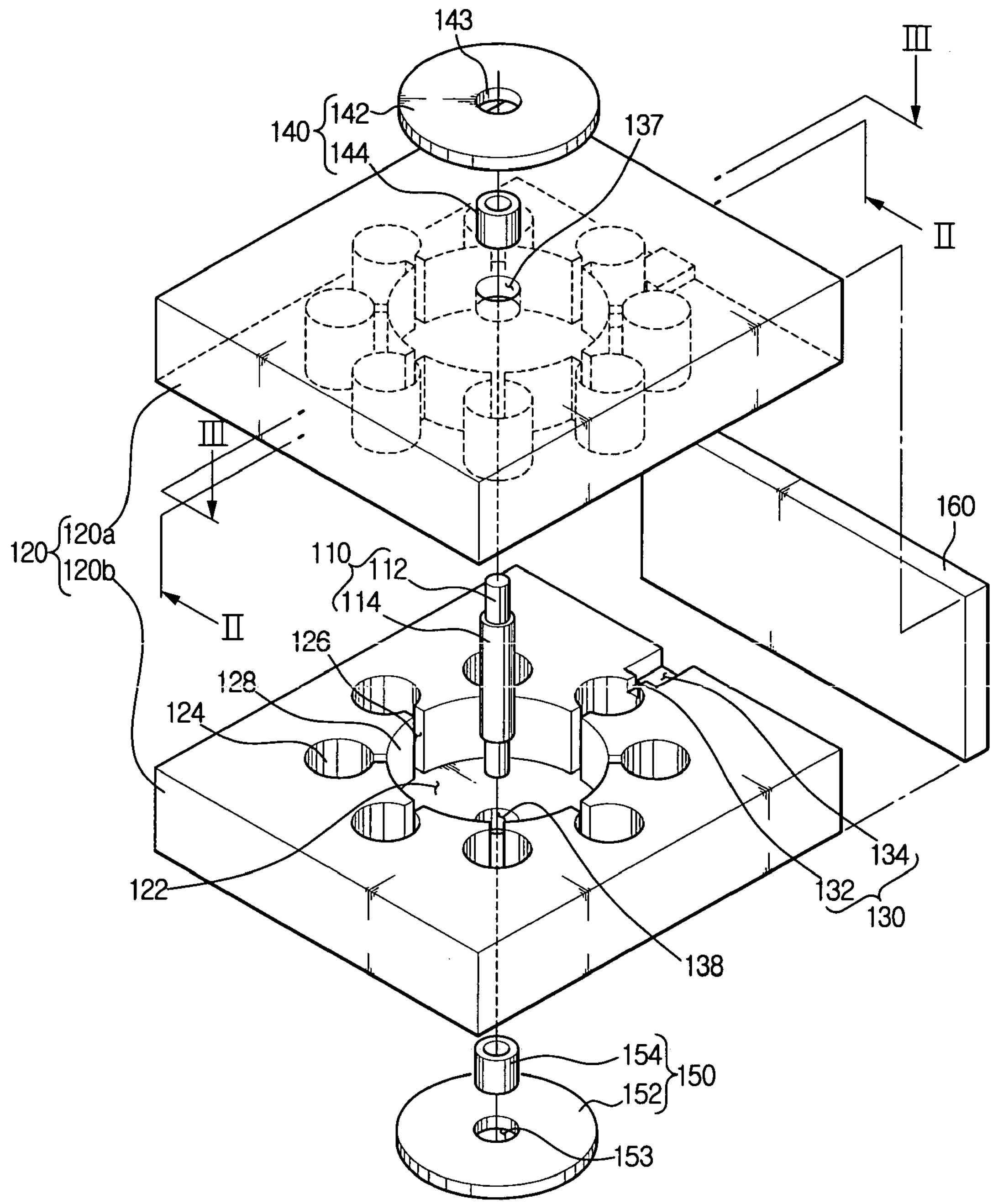
FIG. 1 is an exploded perspective view of a magnetron according to an exemplary embodiment of the present invention.

Exemplary embodiments of the present invention will be described in detail with reference to the accompanying drawings. In the drawings, the same elements are denoted by the same reference numerals throughout the drawings. In the following description, detailed descriptions of known functions and configurations incorporated herein have been omitted for conciseness and clarity.

Figure 2:
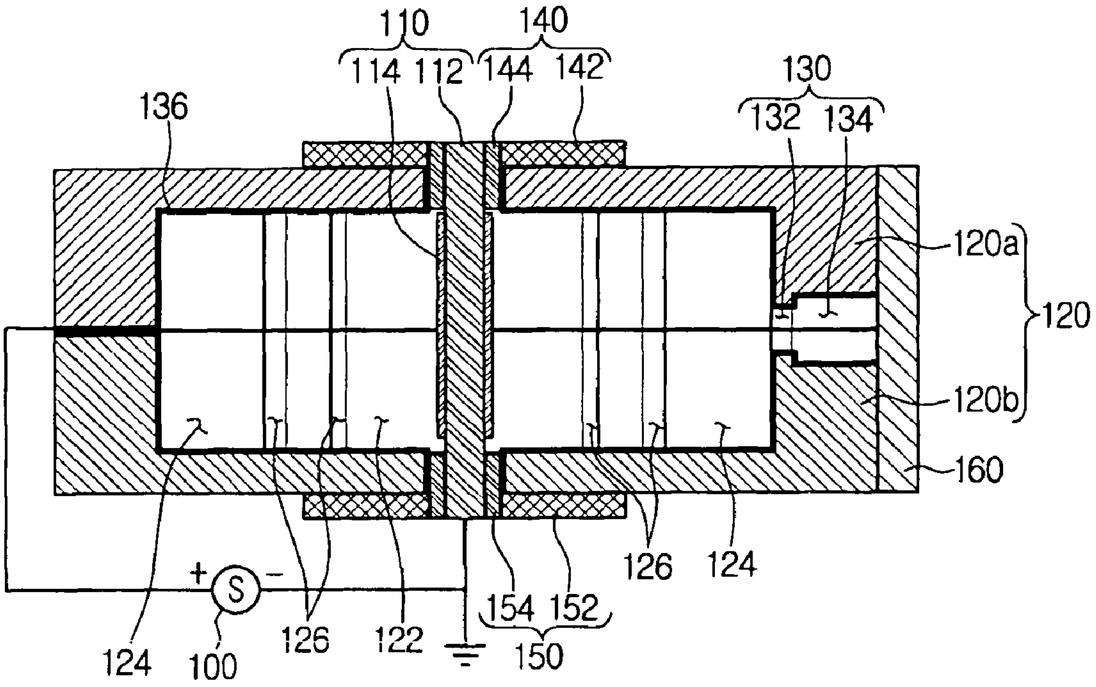
FIG. 2 is a sectional view of the magnetron taken on II-II line of FIG. 1 in assembled state.

Referring to FIGS. 1 and 2, a magnetron according to an exemplary embodiment of the present invention comprises an power source 100, a cathode unit 110, an anode block 120, a pair of magnet units 140, 150, and a sealing member 160.

A terminal of the power source 100 is connected to the cathode unit 110, and the other terminal of the power source 100 is connected to the anode block 120 so as to supply a high voltage to the cathode unit 110 and the anode block 120.

The cathode unit 110 comprises a cathode electrode 112 connected to a terminal of the power source 100, and a nano-tube 114 on an outer circumference of the cathode electrode 112. The cathode electrode 112 is made of a conductive material, and formed at the anode block 120. The nano-tube 114 is spread on the outer circumference of the cathode electrode 112 according to Chemical Vapor Deposition (CVD) so as to be located in an operation chamber 122 of the anode block 120. The nano-tube 114 is made of a conductive material such as a carbon nano-tube, and emits electrons by means of an electric field formed between the cathode electrode 112 and the anode block 120. The nano-tube 114 emits electrons to the operation chamber 122, which will be explained below, by so-called Field Emission Effect.

The anode block 120 comprises a first anode block 120*a* and a second anode block 120*b*. The first anode block 120*a* and the second anode block 120*b* are combined to provide a single anode block 120. The first anode block 120*a* and the second anode block 120*b* take on the symmetrical configuration with respect to each other.

In the first and the second anode blocks 120*a*, 120*b*, the operation chamber 122, the resonance cavity 124, and an emission part 130 are provided.

The cylindrical operation chamber 122 is formed in the center of the anode block 120. The nano-tube 114 is located in the center of the operation chamber 122 so that electrons emitted from the nano-tube 114 can move. The operation chamber 122 has first and second connection holes 137 and 138 to mount the cathode unit 110 and the magnet units 140 and 150 thereto.

In this exemplary embodiment, eight cylindrical resonance cavities 124 are radially arranged at regular intervals along the operation chamber 122. However, the number and configuration of the resonance cavities 124 are not limited as set forth above, and various numbers of resonance cavities and various configurations may be applied as required. Between each of the resonance cavities 124 and the operation chamber 122, connection slots 126 are formed for allowing the resonance cavities 124 to fluidly communicate with each other.

The emission part 130 comprises a coupling iris 132 and a waveguide 134.

The coupling iris 132 is provided in a form of a small slot fluidly communicated with one of the eight resonance cavities 124, and the coupling iris 132 picks up a high-frequency energy generated from each of the resonance cavities 124.

The waveguide 134 is fluidly communicated with the coupling iris 132, and guides the high-frequency energy picked up from the coupling iris 132 to the necessary place.

An exemplary manufacturing process of the anode block 120 will be explained hereinafter. First, a silicon ingot is cut to make the first anode block 120*a* and the second anode block 120*b*. A mask is patterned except for the configurations of the operation chamber 122 of the first anode block 120*a*, the first and the second connection holes 137, 138, the resonance cavities 124, the connection slot 126, and the emission part 130. The operation chamber 122, the first and the second connection holes 137 and 138, the resonance cavities 124, the connection slot 126, and the emission part 130 are etched according to a Reactive Ion Etching (RIE). A conductive material is deposited onto a surface of the etched first anode block 120*a* to form a conductive layer 136. The conductive layer 136 is formed to the operation chamber 122, the first and the second connection holes 137 and 138, the resonance cavities 124, the connection slot 126, the emission part 130, and the unetched portion of the first anode block 120*a*. In other words, the conductive layer 136 is formed on a surface of the first anode block 120*a* facing to the second anode block 120*b*. The conductive layer 136 may be made of aurum (Au), for example, with a high conductivity. The conductive material is deposited because the first anode block 120*a*, which is formed from silicon, is nonconductive.

The second anode block 120*b* takes on the symmetrically same configuration of the first anode block 120*a*, and therefore, the manufacturing process of the first anode block 120*a* is once repeated to form the second anode block 120*b*.

Then, the first and the second anode blocks 120*a* and 120*b* are combined with each other by the above process. The anode block 120 is manufactured according to a semiconductor fabrication process so that each of the resonance cavities 124 can be manufactured with a small size of about several tens of micrometers in diameter and the small size allows the resonance cavities 124 to generate a high frequency energy in the Terahertz band.

The pair of magnet units 140 and 150 comprise a first magnet unit 140 attached to a surface of the first anode block 120*a*, and a second magnet unit 150 attached to a surface of the second anode block 120*b*.

The first magnet unit 140 comprises a first magnet 142 and a first sleeve 144. The first magnet 142 has a first magnet connection hole 143 in the center to engage with the first sleeve 144. The first sleeve 144 is inserted into the connection hole 137 and the first magnet connection hole 143, and an end of the cathode electrode 112 is inserted and fixed into the first sleeve 144. The first sleeve 144 prevents the cathode electrode 112 and the first anode block 120*a* from electrically connecting to each other. In particular, the first sleeve 144 electrically separates the cathode electrode 112 and the conductive layer 136 of the first anode block 120*a* from each other.

The second magnet unit 150 comprises a second magnet 152 with a second magnet connection hole 153 in the center and a second sleeve 154, which are the same as those of the first magnet unit 140. The second magnet 152 has a magnetic pole that is opposite to that of the first magnet 142. In other words, if the first magnet 142 has a "N" magnetic pole, the second magnet 152 has a "S" magnetic pole so as to form a magnetic field, which is in parallel with a center axis of the cathode unit 110 in the operation chamber 122. The second sleeve 154 is inserted into the second magnet connection hole 153 in the center of the second magnet 152 and the second connection hole 138 of the second anode block 120*b* in the same manner as that of the first sleeve 144. The other end of the cathode electrode 112 is inserted into the second sleeve 154.

The sealing member 160 attaches to one side of the anode block 120 with the waveguide 134 so as to form an airtight seal with the operation chamber 122 and the resonance cavity 124 so as to maintain a vacuum state. The sealing member 160 is made of dielectric material through which the high-frequency energy emitted via the waveguide 134 can pass and which is an electrical insulator.

Figure 3:
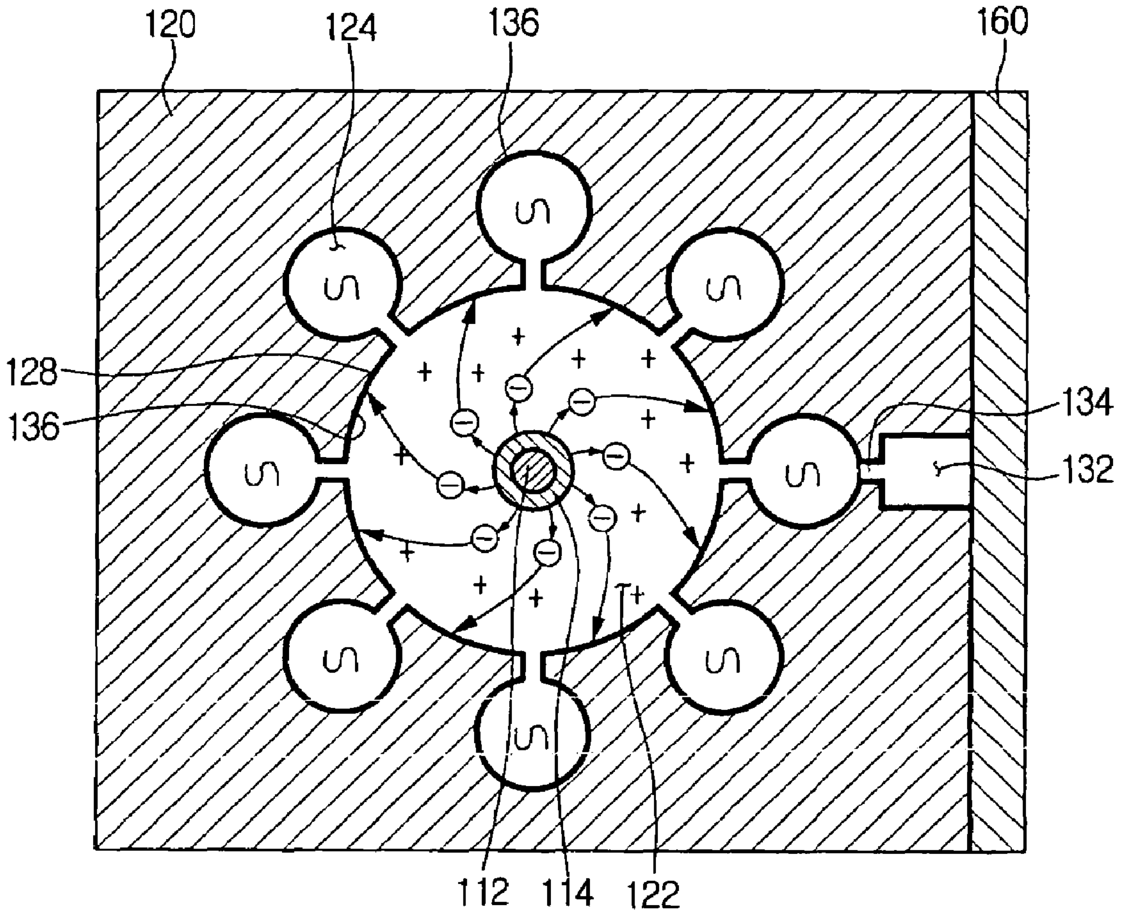
FIG. 3 is a sectional view of the magnetron shown from the perspective of the reference line III-III of FIG. 1, for explaining operations of the magnetron.

With reference to FIG. 3, the operation principle of the magnetron according to an exemplary embodiment of the present invention will be explained hereinafter.

Referring to FIG. 3, a high voltage is supplied from the power source 100 (refer to FIG. 2) to the conductive layer 136 of the anode block 120, and to the cathode electrode 112. Electrons are emitted from the nano-tube 114 on the outer circumference of the cathode electrode 112. The emitted electrons move towards an inner surface 128 of the operation chamber 122, moving in a cycloid due to the magnetic field and the electric field. The magnetic field is formed in parallel with the center axis of the cathode electrode 112 in the operation chamber 122 by the first and the second magnets 142 and 152 (referring to FIG. 2), and the electric field is formed in the operation chamber 122 by the cathode electrode 112 and the anode block 120. The electrons collide with the conductive layer 136 on the inner surface 128 of the operation chamber 122. The electric current oscillates in the conductive layer 136 on the inner surface 128 of the resonance cavities 124 as a plurality of electrons collide with the conductive layer 136 of the inner surface 128 with time intervals. The resonance cavities 124 are electrically equivalent to the series circuit of a capacitor and an inductor so that the oscillation of the electric current reaches the resonance frequency of the resonance cavities 124. A high resonance frequency in the Terahertz band is formed due to the small size of the resonance cavities 124, which have a diameter of approximately several tens of micrometers so that the high frequency energy in the Terahertz band is generated. The high-frequency energy is generated in each of the resonance cavities 124, and is picked up by the coupling iris 132. The picked-up high-frequency energy is transmitted to a necessary place by the waveguide 134. The sealing member 160 is made of material through which the high frequency energy can pass, and an electrical nonconductor, so as to not block the emission of the high-frequency energy.

Figure 4:
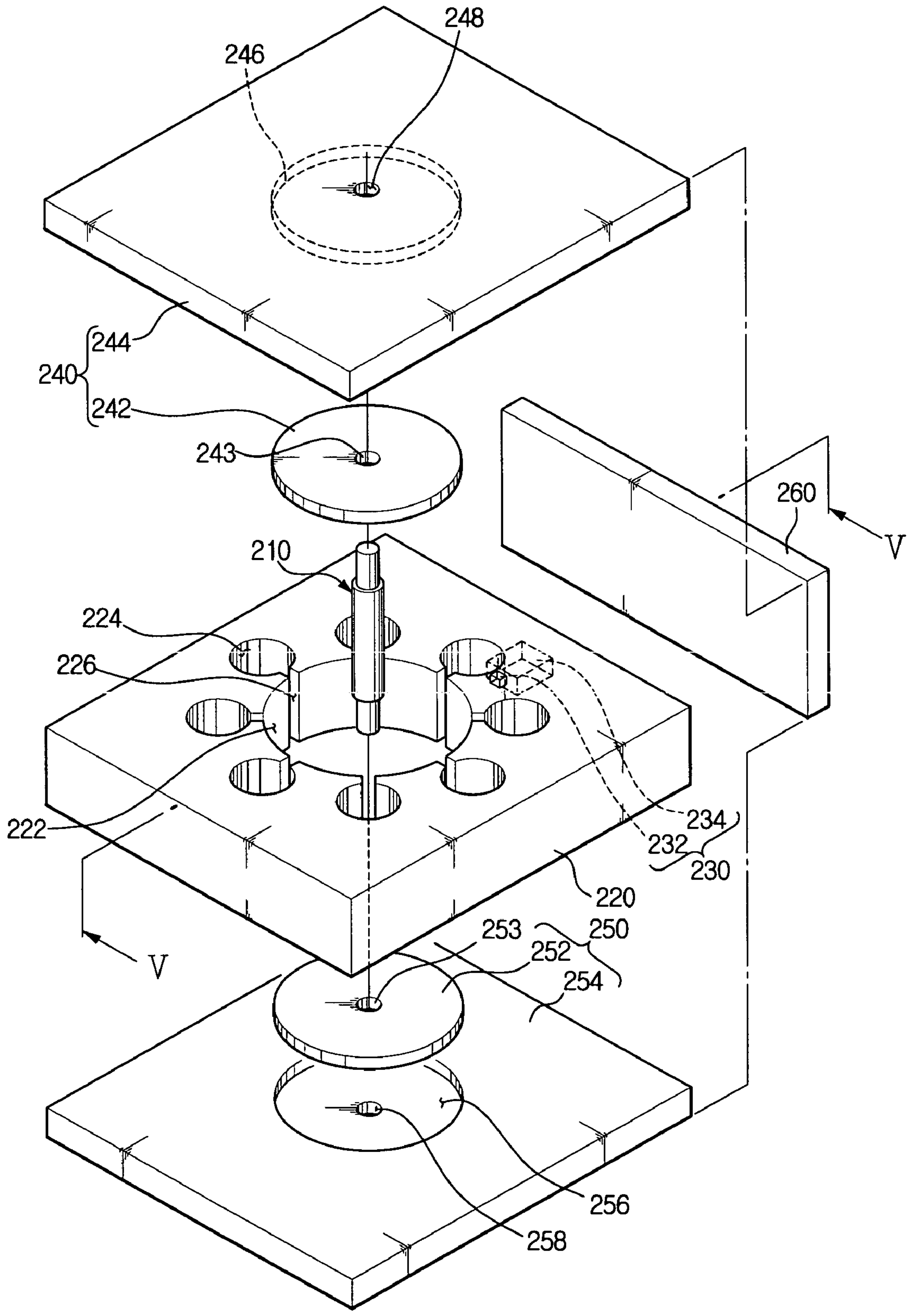
FIG. 4 is an exploded perspective view of a magnetron according to another exemplary embodiment of the present invention.
Figure 5:
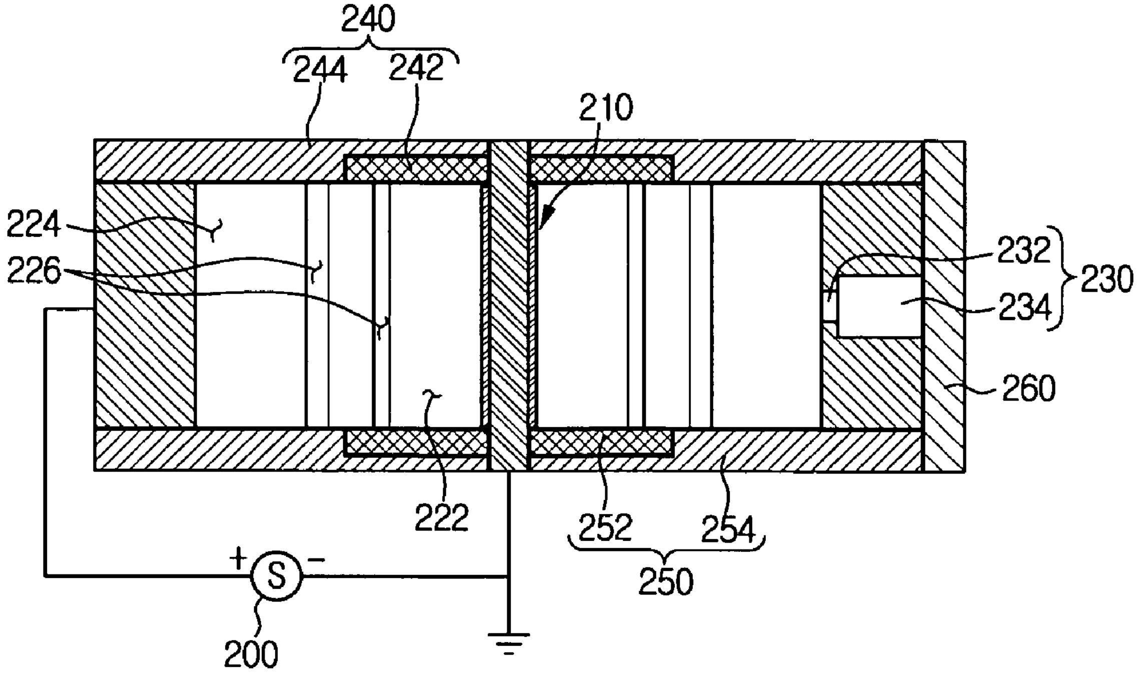
FIG. 5 is a sectional view of the magnetron shown from the perspective of the reference line V-V of FIG. 4 in assembled state.

FIG. 4 and FIG. 5 depict a magnetron according to another exemplary embodiment of the present invention. The magnetron according to the exemplary embodiment of the present invention shown in FIG. 4 and FIG. 5 differs from the magnetron according to the first exemplary embodiment in that an anode block 220 is a single layer, the anode block 220 is made of conductive material, and dedicated first and second plates 244 and 254 are used to cover both sides of the anode block 220. The magnetron according to the exemplary embodiment of the present invention shown in FIG. 4 and FIG. 5 will be explained in detail hereinafter.

The magnetron according to the exemplary embodiment of the present invention shown in FIG. 4 and FIG. 5 comprises a power source 200, a cathode unit 210, an anode block 220, a pair of magnet units 240 and 250, and a sealing member 260.

The power source 200, the cathode unit 210, and the sealing member 260 have the same structure as those described with respect to the first exemplary embodiment of the present invention, and therefore, detailed description thereof will be omitted.

The anode block 220 comprises an operation chamber 222, connection slots 226, resonance cavities 224, a coupling iris 232, and an emission part 230 with a waveguide 234, which are the same as those according to the first exemplary embodiment of the present invention. The configurations, sizes, and positions of the aforementioned features are the same as those of the first exemplary embodiment of the present invention, and therefore, detailed description thereof will be omitted. However, according to the exemplary embodiment shown in FIG. 4 and FIG. 5, it is not necessary to form a dedicated conductive layer since the anode block 220 is made of conductive material in a different way from the first exemplary embodiment of the present invention.

The pair of magnet units 240 and 250 comprises a first magnet unit 240 and a second magnet unit 250.

The first magnet unit 240 comprises a first magnet 242 and a first plate 244 having a first receiving part 246 for receiving the first magnet 242. The first magnet 242 has a first magnet connection hole 243 in the center, and the first receiving part 246 has a first connection hole 248 in the center of the first receiving part 246. An end of the cathode unit 210 is inserted and fixed into the first magnet connection hole 243 and the first connection hole 248 in an airtight manner. The first plate 244 is attached to a surface of the anode block 220. The first magnet 242 is located at an end of the operation chamber 222.

The second magnet unit 250 comprises a second magnet 252 and a second plate 254 with a second receiving part 256 for receiving the second magnet 252. The second magnet 252 and the second receiving part 256 have a second magnet connection hole 253 and a second connection hole 258 to insert the other end of the cathode unit 210 therein. The second plate 254 is attached to the other end of the anode block 220. The second magnet 252 is located at the other end of the operation chamber 222 to face the first magnet 242 such that a magnetic field forms in parallel with a central axis of the cathode unit 210 in the operation chamber 222.

The operation principle of the magnetron according to the exemplary embodiment of the present invention shown in FIG. 4 and FIG. 5 is as the same as that according to the first exemplary embodiment of the present invention, and therefore, detailed description thereof will be omitted.

If exemplary embodiments of the present invention are applied as described above, the resonance cavities 124 and 224 are manufactured according to a semiconductor fabrication process so that the resonance cavities 124 and 224 can be manufactured with diameter of several tens of micrometers, and the small size allows the resonance cavities to generate a high-frequency energy in the Terahertz band.

Additionally, according to exemplary embodiments of the present invention, the magnetron is manufactured according to the semiconductor fabrication process so as to be micro-miniaturized to several hundred micrometers.

While the invention has been shown and described with reference to certain exemplary embodiments thereof, it will be understood by those skilled in the art that various changes in form and details may be made to the exemplary embodiments of the invention without departing from the spirit and scope of the invention as defined by the appended claims.

What is claimed is:

1. A magnetron comprising:

a cathode unit which is connected to a terminal of a power source, and which selectively emits an electron according to whether power is supplied;

an anode block which is connected to another terminal of the power source, the anode block comprising:

an operation chamber, within which the emitted electron moves in the operation chamber; and at least one resonance cavity which generates a high-frequency energy, which is between 300 GHz and 3 THz, as a result of movement of the emitted electron; and a plurality of magnet units which form a magnetic field in the operation chamber.

2. The magnetron according to claim 1, further comprising a plurality of resonance cavities which are radially arranged at regular intervals around the operation chamber.

3. The magnetron according to claim 2, wherein the operation chamber and the resonance cavities are cylindrical in shape.

4. The magnetron according to claim 3, wherein the anode block comprises a plurality of connection slots, and each connection slot is fluidly communicated with one of the plurality of resonance cavities and the operation chamber.

5. The magnetron according to claim 1, wherein the cathode unit comprises:

a cathode electrode; and a nano-tube which is formed on an outer circumference of the cathode electrode.

6. The magnetron according to claim 1, wherein the anode block comprises an emission part which emits the high-frequency energy to a desired location.

7. The magnetron according to claim 6, wherein the emission part comprises:

a coupling iris which is fluidly communicated with at least one of the resonance cavities; and a waveguide which is fluidly communicated with the coupling iris.

8. The magnetron according to claim 6, further comprising a sealing member which is attached to the anode block and forms an airtight seal with the waveguide.

9. The magnetron according to claim 8, wherein the sealing member comprises an insulator.

10. The magnetron according to claim 9, wherein the anode block comprises a first anode block and a second anode block which have identical configurations at facing surfaces thereof.

11. The magnetron according to claim 10, wherein the plurality of magnet units comprises:

a first magnet which is attached to a surface of the first anode block that is opposite to a surface of the first anode block that faces the second anode block, wherein the first magnet comprises a first magnet connection hole in the center of the first magnet;

a second magnet which is attached to a surface of the second anode block that is opposite to a surface of the second anode block that faces the first anode block, wherein the second magnet comprises a second magnet connection hole in the center of the second magnet;

a first sleeve wherein part of the first sleeve is inserted into the first magnet connection hole, wherein a remaining part of the first sleeve is inserted into a first connection hole which is formed on a side of the operation chamber, and a side of the cathode unit is inserted into the first sleeve; and a second sleeve wherein part of the second sleeve is inserted into the second magnet connection hole, a remaining part of the second sleeve is inserted into a second connection whole which is formed on another side of the operation chamber, and another side of the cathode unit is inserted into the second sleeve.

12. The magnetron according to claim 11, wherein the first anode block and the second anode block comprise a silicon substrate, and wherein a conductive layer is deposited on surfaces of the first anode block and the second anode block that face each other.

13. The magnetron according to claim 12, wherein the conductive layer comprises aurum.

14. The magnetron according to claim 12, wherein the first sleeve and the second sleeve are nonconductive.

15. The magnetron according to claim 9, wherein the plurality of magnet units comprises:

a first magnet and a second magnet which have different magnetic poles;

a first plate having a first receiving part, which receives the first magnet, and wherein the first plate is attached to a side of the anode block; and a second plate having a second receiving part which receives the second magnet, wherein the second plate is attached to another side of the anode block.

16. The magnetron according to claim 15, wherein the anode block comprises conductive material.

17. A magnetron comprising:

a cathode unit which is connected to a terminal of a power source, and selectively emits an electron according to whether power is supplied;

a first anode block and a second anode block which are connected to another terminal of the power source; and a plurality of magnet units;

wherein the first anode block comprises:

a first portion of an operation chamber at a first surface of the first anode block, wherein the emitted electron moves in the operation chamber;

a first portion of a resonance cavity, wherein the resonance cavity generates a high-frequency energy as a result of movement of the emitted electron; and a first portion of an emission part, wherein the emission part guides the generated high-frequency energy to a desired location;

wherein the second anode block comprises:

a second portion of the operation chamber at a first surface of the second anode block, wherein the first surface of the second anode block faces the first surface of the first anode block;

a second portion of the resonance cavity; and a second portion of the emission part;

wherein at least one of the plurality of magnet units is attached to a second surface of the first anode block that is opposite to the first surface of the first anode block;

wherein at least one of the plurality of magnet units is attached to a second surface of the second anode block that it opposite to the first surface of the second anode block; and wherein the plurality of magnet units form a magnetic field in the operation chamber.

18. The magnetron according to claim 17, wherein a conductive layer is deposited on the first surface of the first anode block and the first surface of the second anode block.

19. A magnetron comprising:

a cathode unit which is connected to a terminal of a power source and selectively emits an electron according to whether power is supplied;

an anode block which is connected to another terminal of the power source, and the anode block comprising:

an operation chamber wherein the emitted electron moves in the operation chamber;

at least one resonance cavity which generates a high-frequency energy which is between 300 GHz and 3 THz, as a result of movement of the emitted electron; and an emission part which guides the generated high-frequency energy to a desired location; and a plurality of magnet units, wherein at least one of the plurality of magnet units is attached to a side of the anode block, at least one of the plurality of magnet units is attached another side of the anode block, and the plurality of magnet units form a magnetic field in the operation chamber.

20. The magnetron according to claim 19, wherein the anode block comprises conductive material.

21. The magnetron according to claim 1, wherein the at least one resonance cavity generates a high-frequency energy in the Terahertz band.

22. The magnetron according to claim 1, wherein the at least one resonance cavity is less than 1 millimeter in diameter.

23. The magnetron according to claim 1, wherein the at least one resonance cavity is less than 100 micrometers in diameter.

* * * * *